US008053256B2

(12) United States Patent  
Howard et al.

(10) Patent No.: US 8,053,256 B2
(45) Date of Patent: Nov. 8, 2011

(54) VARIABLE THICKNESS SINGLE MASK ETCH PROCESS

(75) Inventors: Gregory E. Howard, Plano, TX (US); Leland Swanson, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 477 days.

(21) Appl. No.: 12/416,858

(22) Filed: Apr. 1, 2009

(65) Prior Publication Data

US 2010/0167424 A1 Jul. 1, 2010

Related U.S. Application Data

(60) Provisional application No. 61/141,835, filed on Dec. 31, 2008.

(51) Int. Cl.
*H01L 21/66* (2006.01)
(52) U.S. Cl. .................... 438/14; 257/E21.528
(58) Field of Classification Search .............. 438/14; 257/E21.528
See application file for complete search history.

(56) References Cited

U.S. PATENT DOCUMENTS

| 7,061,603 | B2 * | 6/2006 | Sato et al. ................ 356/237.4 |
| 7,195,845 | B2 * | 3/2007 | Kobayashi et al. ............ 430/5 |
| 2001/0053588 | A1 * | 12/2001 | Neily et al. .................. 438/504 |
| 2004/0009295 | A1 * | 1/2004 | Kobayashi et al. .......... 427/240 |

* cited by examiner

*Primary Examiner* — Mary Wilczewski
*Assistant Examiner* — Toniae Thomas
(74) *Attorney, Agent, or Firm* — Jacqueline J. Garner; Wade J. Brady, III; Frederick J. Telecky, Jr.

(57) ABSTRACT

The present invention relates to a method of performing a variable film etch using a variable thickness photomask material. Essentially, a thickness of an adjustable film layer is measured and converted into a contour map of film thickness over a region of a semiconductor body (e.g., wafer). An etch mask layer (e.g., photoresist) is then formed above the adjustable film layer and is selectively patterned by a reticleless exposure system (e.g., DMD exposure system). The selective patterning subjects different regions of the etch mask layer to varying exposure times dependent upon the thickness of the underlying adjustable film. The more etching needed to provide the underlying film to a nominal thickness, the longer the exposure of the etch mask. Therefore, the resultant etch mask, after exposure, comprises a topology allowing for various degrees of selective etching of the underlying film resulting in a uniform film.

20 Claims, 7 Drawing Sheets

VARIABLE THICKNESS SINGLE MASK ETCH PROCESS

RELATED APPLICATION

This application claims priority to U.S. Provisional Patent Application Ser. No. 61/141,835 filed Dec. 31, 2008, entitled, "Variable Thickness Single Mask Etch Process".

FIELD

The disclosure herein relates generally to semiconductor processing, and more particularly to a method of fabricating a uniform film thickness on to a semiconductor wafer.

BACKGROUND

Integrated chips are formed by complex fabrication processes comprising a plurality of steps including film depositions, dopings, thermal anneals, etc. These complex processes can be used to form integrated chips having a plurality of diverse devices (e.g., analog devices, digital devices, etc.). For example, single integrated chips having broad functionality (e.g., digital, analog, mixed-signal, and radio-frequency functions) that may extend into the radio frequency and mixed-signal areas require the integration of passive devices, such as capacitors and/or resistors, on to an IC die. Many devices have operational characteristics that are heavily dependent upon their spatial layout. Therefore, during the formation of such devices variations in the fabrication process (process variations) can have a large impact on the operational characteristics of such devices by changing the spatial layout of the devices.

For example, there are various types of capacitors that can be used on integrated chips. Metal-oxide-silicon (MOS) capacitors can be used as a passive capacitor. Metal-insulator-metal capacitors (MIM or MIM cap) are also commonly found in integrated chips. As the name implies, MIM caps are usually found between interconnect metal levels. MIM caps are integrated into various integrated circuits for applications such as analog-logic, analog-to-digital, mixed signal and radio frequency circuits. Current methods of integration of MIMs into integrated circuits require multiple photolithographic and etching steps.

Figure 1:
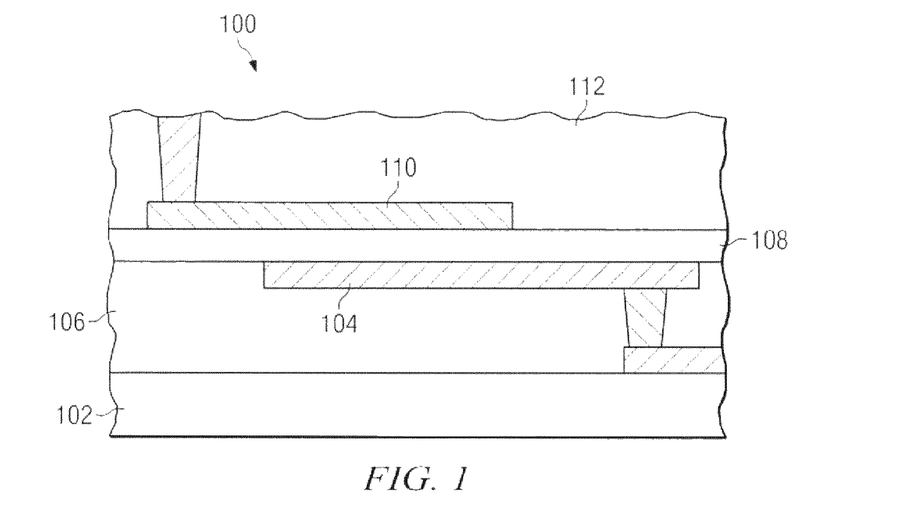
FIG. 1 illustrates a cross sectional view of a typical semiconductor MIM capacitor.

FIG. 1 illustrates a cross sectional view of a typical MIM capacitor. Although FIG. 1 illustrates a MIM cap, it will be appreciated that other capacitors (e.g., MOS caps) share a similar structure. As shown in FIG. 1, a MIM cap 100 is formed over a semiconductor body 102. The MIM cap 100 is configured to comprise a lower gate electrode layer 104 (e.g., M3) comprised within dielectric material 106 and an upper gate electrode layer 110 (e.g., M4) comprised within dielectric material 112. As shown in FIG. 1, the lower gate electrode 104 is vertically separated from the upper gate electrode layer 110 by one or more dielectric layers 108. Typically the one or more dielectric layers 108 are comprised of high k dielectric material to increase capacitance of the device 100 while decreasing the size. Precision capacitors often use one or more dielectric layers comprising an oxide-nitride-oxide (ONO) dielectric stack, which allows for thinner layers and increased performance. Alternatively, other materials such as tantalum oxide ($Ta_2O_5$) or hafnium oxide ($HfO_2$) are also used. It will be appreciated that capacitors may also comprise additional layers between the lower and upper metal plates also.

Accordingly, as shown in FIG. 1, precise process control of film deposition thickness of a dielectric layer in a capacitor is important to the performance of the device. Other devices share a similar dependence between performance and process control of thin film depositions. For example, standard analog and mixed signal silicon processes require precise control of the thickness of deposited films/layers to provide uniformity of the design from fab-to-fab, lot-to-lot, wafer-to-wafer, and even within a wafer.

Various techniques are often used to provide uniformity of deposited films. For example, standard techniques comprise providing multiple sources for the deposition of gases, providing uniformity of temperature across a semiconductor wafer, providing uniformity of plasma conditions across the wafer. None the less, such techniques still allow for variation within the devices and often it is necessary to implement a method of making a post fabrication adjustment to the devices to bring device specifications back within their original design value.

SUMMARY

The following presents a simplified summary in order to provide a basic understanding of one or more aspects of the invention. This summary presents one or more concepts of the invention in a simplified form as a prelude to the more detailed description that is presented later and is not an extensive overview of the invention. In this regard, the summary is not intended to identify key or critical elements of the invention, nor does the summary delineate the scope of the invention.

The present invention relates to a method for forming a uniform film thickness over a local or global region of a semiconductor body (e.g., semiconductor wafer). More particularly, the present invention relates to a method by which film thickness is measured and subsequently adjusted during integrated chip processing to correct for process variation(s). Essentially, a thickness of an adjustable film layer is measured and converted into a two dimensional contour map of the film thickness over a region of a semiconductor body (e.g., wafer). An etch mask layer (e.g., a hardmask photoresist layer) is then formed above the adjustable film layer and is selectively patterned by a reticleless exposure system (e.g., SLM exposure system, DMD exposure system). The selective patterning comprises subjecting different regions of the etch mask layer to varying exposure times or levels dependent upon the thickness of the underlying adjustable film layer (e.g., the variation in thickness from nominal designed thickness). The greater the amount of etching needed to adjust the underlying adjustable film layer to a nominal thickness, the longer the exposure of the etch mask layer and therefore the thinner the overlying etch mask layer. Therefore, the resultant etch mask, after exposure, comprises a mask of varying thicknesses which allows for various degrees of selective etching of the underlying adjustable film layer. The semiconductor body, comprising the adjustable film layer and etch mask layer, is then etched. After etching, the mask's topography results in a uniform film over the region of the semiconductor body (e.g., wafer).

The following description and annexed drawings set forth in detail certain illustrative aspects and implementations of the invention. These are indicative of but a few of the various ways in which the principles of the invention may be employed.

DETAILED DESCRIPTION OF THE INVENTION

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

Parameter variation over process (i.e., lot to lot, wafer to wafer, and even within the wafer) for discrete components formed onto integrated chips can have a large impact on device performance, in some cases causing on wafer components to vary from design by as much as 20% of the device size. Analog designs with such wide variance in passive components are rarely optimal, leaving the size of a design bigger than it could be or the performance of the devices below what could be achieved. Present solutions to this problem include the performance of post processing trimming use laser cuts or electrical fuses, either pre or post packaging. Unfortunately, these solutions have a number of disadvantages. Post processing trimming is expensive (e.g., excessive probe costs per market requirements, excessive testing cost and performance requirements), time consuming, and not always possible due to die area limitations (e.g., due to extra trim pads, extra laserable links. For example, designing circuits to account for any process variation by allowing post build laser or electrical trimming of a device may add up to an additional 20% extra capacitance area (e.g., plus fusing links, etc.) to compensate for the capacitance variation in the design. Such an increase in design size is extremely costly. Accordingly, a process with improved process control of deposited films during semiconductor fabrication is provided herein.

The present invention relates to a method for forming a uniform film thickness over a local or global region (e.g., of a semiconductor body). More particularly, the present invention relates to a method by which film thickness is measured and subsequently adjusted during integrated chip processing to correct for process variation(s). Essentially, a thickness of an adjustable film layer is measured and converted into a two dimensional contour map of the film thickness over a region of a semiconductor body (e.g., wafer). An etch mask layer (e.g., photoresist) is then formed above the adjustable film layer and is selectively patterned (e.g., by a reticleless exposure system). The selective patterning comprises subjecting different regions of the etch mask layer to varying exposure times or levels dependent upon the thickness of the underlying adjustable film layer (e.g., the variation in thickness from nominal designed thickness). The greater the amount of etching needed to adjust the underlying adjustable film layer to a nominal thickness, the longer the exposure of the etch mask layer and therefore the thinner the overlying etch mask layer. In other words, the etch mask layer is formed to varying thicknesses which allow for selective degrees of etching to the underlying adjustable film layer. After etching, the mask's topography results in a uniform film over the region of the semiconductor body (e.g., wafer). Therefore, by performing a variable film etch using a variable thickness photomask material, the present invention provides a uniform film.

Figure 2:
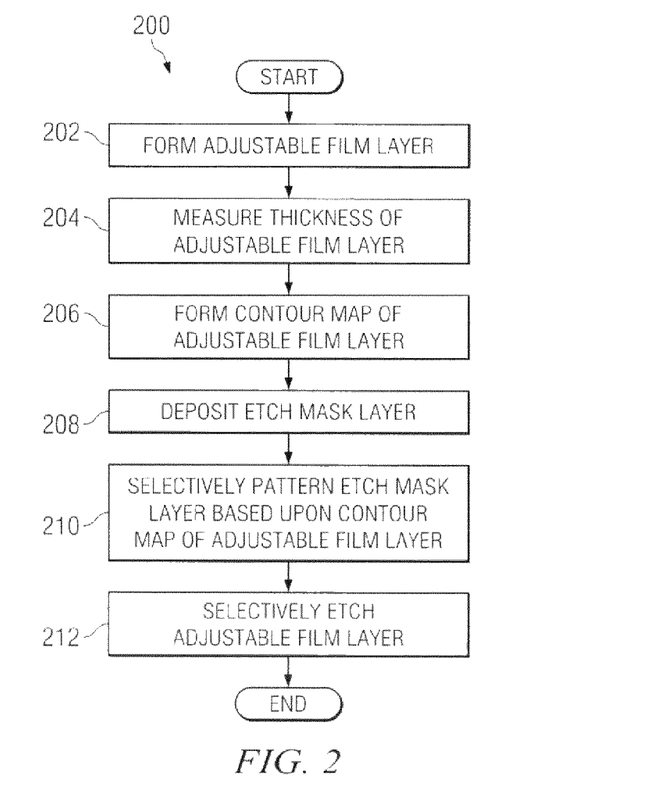
FIG. 2 illustrates a flow diagram of a method for forming a uniform film thickness over a local or global region of a semiconductor body.

FIG. 2 illustrates a first embodiment of the present invention, a method 200 for forming a uniform film thickness over a local or global region of a semiconductor body (e.g., semiconductor wafer). While method 200 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

As described below method 200 comprises a method by which a thickness of an adjustable film layer is measured and converted into a contour map of film thickness over a region of a semiconductor body. A etch mask layer (e.g., photoresist) is selectively patterned to varying thicknesses by a reticleless exposure system (e.g., DMD exposure system) driven by the contour map. The patterned etch mask layer is removed during an etch process with adjustable film areas under thinner etch mask material being etched more than adjustable film areas under a thicker etch mask material.

At 202 an adjustable film layer is formed above the surface of a semiconductor body (e.g., wafer). The adjustable film layer may comprise any deposited layer of an integrated chip (IC) (e.g., a dielectric layer, a metal layer, etc.). In one embodiment, the adjustable film layer comprises a layer relating to an operational parameter of a device (e.g., capacitance, resistance, breakdown voltage), thereby the adjustment of which allows subsequent in-situ adjustment of the device during processing to account for variations in the fabrication process.

For example, in one particular embodiment, in a passive semiconductor capacitor, the adjustable film layer comprises a capacitor dielectric layer, the subsequent adjustment of which adjusts the capacitive value of the passive capacitor. In an alternative embodiment, in a semiconductor device (e.g., MOSFET), the adjustable film layer comprises a gate oxide layer, the subsequent adjustment of which adjusts the breakdown voltage of the semiconductor device. In yet another alternative embodiment, in a passive semiconductor resistor, the adjustable film layer comprises a polysilicon layer of a semiconductor resistor, the subsequent adjustment of which adjusts the resistance of the semiconductor resistor.

Figure 3:
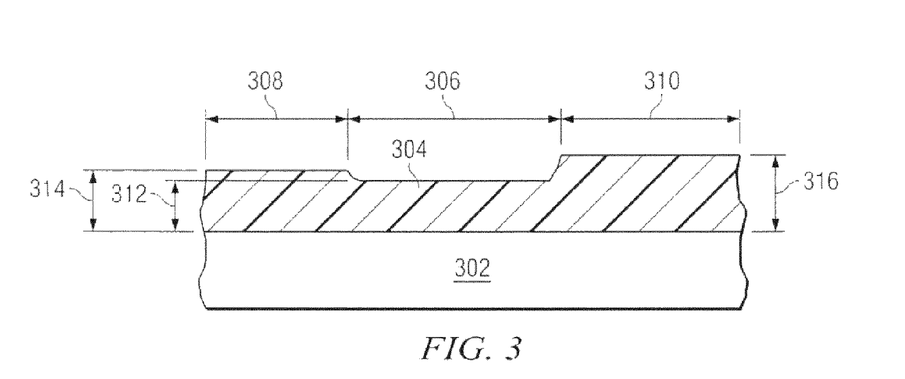
FIG. 3 illustrates a cross sectional view of a semiconductor body according to the method of FIG. 2.

FIG. 3 illustrates an example of a semiconductor body 302 with an adjustable film layer 304 formed above the semiconductor body 302. As shown in the example of FIG. 3, the adjustable film layer 304 has three different regions respectively comprising different thicknesses. More particularly, in region 306 the adjustable film layer comprises a nominal thickness 312 (i.e., a thickness equal to the designed thickness value) and in regions 308 and 310 the adjustable film layer comprises a thickness that is greater than the nominal design value to varying degrees. In particular, in region 308 the adjustable film layer comprises thickness 314 greater than the nominal thickness (e.g., 10% greater than the nominal thickness) and in region 310 the adjustable film layer comprises thickness 316 greater than the nominal thickness (e.g., 20% greater than the nominal thickness).

A plurality of thicknesses of the adjustable film layer are measured at 204. The plurality of thicknesses are measured in a plurality of locations over the surface of the semiconductor body. It will be appreciated that the thickness of the film is measured in spatially diverse locations sufficient to characterize the film over a local or global region of the semiconductor body. For example, in an array of passive devices (e.g., resistors, capacitors) the thickness of the adjustable film layer may be measured at one or more locations of respective passive devices. Referring again to FIG. 3, in one embodiment, measurement of the adjustable film layer 304 would take one or more measurements of the film thickness in each of the different film thickness regions 306, 308 and 310.

Figure 4:
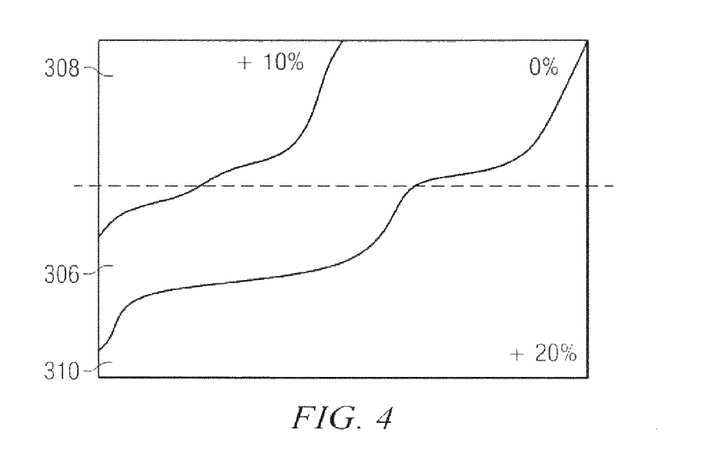
FIG. 4 illustrates a contour map of the semiconductor body of FIG. 3.

At 206 a contour map of the adjustable film layer is formed. The contour map (e.g., a two dimensional contour map) is a map formed from the measurements taken at 204. The measurements are fitted to a two dimensional contour map of the adjustable film thickness over the semiconductor body. Analogous to a topographical map, the contour map shows the thickness of the adjustable film layer as a function of its spatial position on the semiconductor body. In one embodiment, the contour map comprises a detail percentage adjustment to the thickness of the adjustable film required to achieve nominal thickness (i.e., designed thickness) within respective contours. For example, as shown in FIG. 4 the contour map illustrates a region 306 having a nominal thickness which would require no adjustment to achieve the nominal (e.g., designed) thickness (e.g., associated with thickness 312 of FIG. 3), a region 308 which would require a 10% adjustment to achieve the nominal thickness of the adjustable film layer (e.g., associated with thickness 314 of FIG. 3), and a region 310 which would require a 20% percent adjustment to achieve the nominal thickness of the adjustable film layer (e.g., associated with thickness 316 of FIG. 3). In other words, if the adjustable film where adjusted according to the percentages of the contour map, the adjustable film layer would be uniform over the surface of the given region of the semiconductor body.

Figure 5:
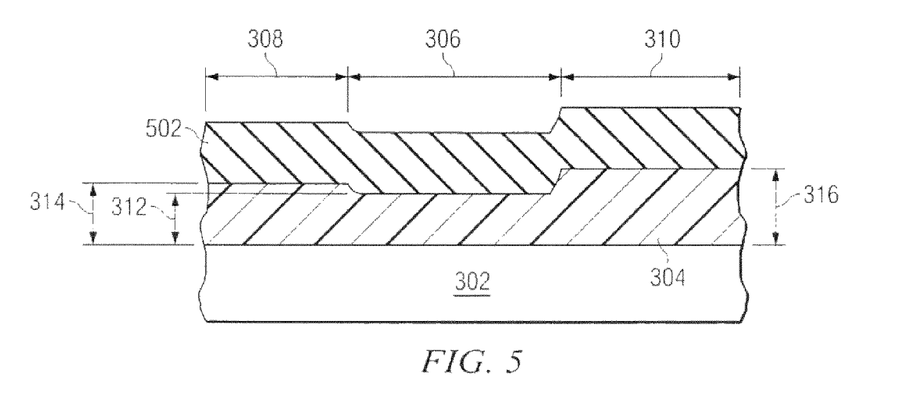
FIG. 5-8 illustrates additional cross sectional views of a semiconductor body according to the method of FIG. 2.

An etch mask layer is deposited onto the surface of the semiconductor body at 208. The etch mask layer may comprise one or more different materials. In one embodiment, the etch mask layer (mask layer) comprises a positive photoresist layer formed on the semiconductor body above the adjustable film layer. In such an embodiment, the photoresist layer may be spun onto the wafer at one or more high speeds (e.g., 1000 rpm) to form a substantially uniform layer of photoresist on the surface of the semiconductor body having a thickness of 100-2000 nm, for example. FIG. 5 illustrates a photoresist mask layer 502 formed above the adjustable film layer 304.

At 210 the etch mask layer is selectively patterned based upon the contour map of the adjustable film layer thickness. The mask layer is selectively patterned to varying degrees (i.e., the mask layer is selectively pattered to remove varying thicknesses of the mask layer) based upon the contour map, wherein selectively patterning the mask layer comprises exposing different spatial coordinates of the mask layer to different exposure times by a reticleless exposure system. In other words, the selective patterning comprises subjecting different regions of the etch mask to varying exposure times dependent upon the thickness of the underlying adjustable film layer (e.g., the variation in thickness from nominal designed thickness). The greater the amount of etching needed to provide the underlying adjustable film layer to a nominal thickness, the longer the exposure of the etch mask layer and therefore the thinner the overlying etch mask layer. Therefore, the resultant etch mask, after exposure, comprises a mask of varying thicknesses which allows for various degrees of selective etching of the underlying adjustable film layer. In one embodiment, selectively patterning the etch mask layer comprises exposing three or more spatial regions of the etch mask layer to three or more different exposure times.

In one embodiment, the exposure of the etch mask layer is performed by utilizing the adjustment map to form an etch mask layer (e.g., photomask) which is patterned by a reticleless exposure system. In one embodiment, the exposure of the etch mask layer is controlled by a spatial light modulator (SLM) exposure system (i.e., an optical maskless lithography system). The maskless lithography system replaces a reticle with a spatial light modulator (SLM), notably a digital micromirror device (DMD), a liquid crystal display (LCD), or the like. The SLM includes an array of active areas (e.g., mirrors or transmissive areas) that can be modulated to form a desired pattern. An algorithm, based on the contour map, defines a desired exposure pattern which is used to modulate the active areas. Preferably, the SLM is arranged to enable suitable exposure of all desired areas on a substrate for each pattern during only one pass of the substrate.

In one particular embodiment, the adjustment map is utilized in a low resolution (micron level) digital micro-mirror (DMD) exposure system to selectively expose a photomask by using the switching of a micromechanical mirror on the fly mask. In such an embodiment, the DMD exposure system forms a photo mask (i.e., a photoresist mask) which provides an on the fly lithography approach that allows very fast adjustments (e.g., typically less than a minute across a wafer) to be made to the adjustable film thickness during the fabrication process For example, in one particular embodiment, shown in FIG. 6, the photoresist mask layer 502 comprises a positive photoresist (i.e., a photoresist that will be developed away only when exposed to an incident illumination) that is selectively patterned so that different thicknesses of the photoresist mask layer 502 are removed in different regions based upon the thickness of the underlying adjustable film layer 304. For example, in region 306, the photoresist mask layer 502 is not exposed since the underlying adjustable film layer 304 comprises a thickness 312 of nominal value. However, in region 308 where the adjustable film layer 304 has a thickness 314 that is greater than the nominal value (e.g., 10% greater than the nominal value), the photoresist mask layer 502 is exposed 602 and patterned to remove some of its thickness. Similarly, in region 310, where the adjustable film layer 304 has a thickness 316 greater than the nominal value (e.g., 20% greater than the nominal value), the photoresist mask layer 502 is exposed 602 and patterned to remove the entire photoresist mask layer 502. In one embodiment, a photoresist mask layer 502 is patterned using a photoresist developer which selectively removes the photoresist according to its exposure level (i.e., time).

Figure 6:
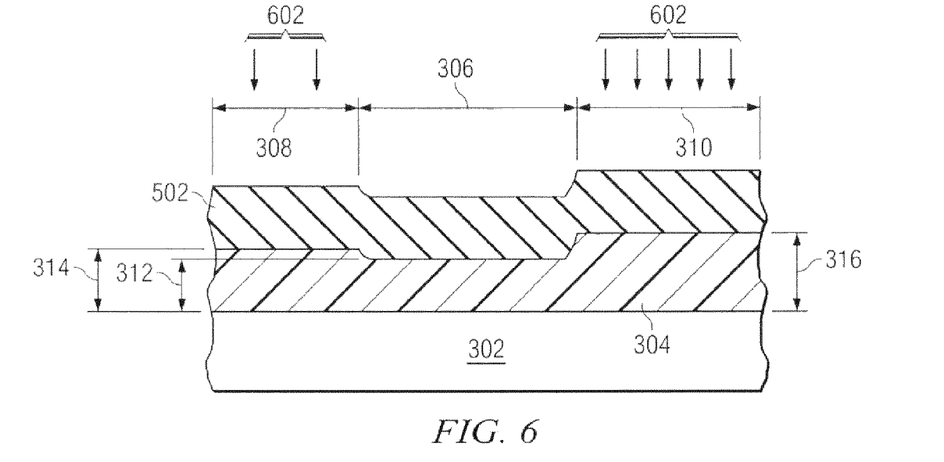

It will be appreciated that FIG. 6 is not intended to illustrate the amount of etch mask removed for a 10% or 20% reduction in the underlying adjustable film layer. Rather the amount of etch mask removed during the patterning process is will depend on a number of parameters including the etch mask material, the underlying adjustable film material, the etchant used in the processes, etc. Furthermore, although FIGS. 3-8 illustrate film thicknesses that have different thicknesses of 0%, 10% and 20%, this is only an example and the disclosed method can be used in conjunction with any plurality of film thicknesses.

At 212 the adjustable film layer is selectively etched in-situ to processing of the semiconductor body based upon the patterned etch mask layer. Selective etching substantially planarizes the adjustable film layer in the local or global region of the semiconductor body. More, particularly, the patterned etch mask layer is removed during the etch process with those areas comprising thinner etch mask layer material being etched more than those areas comprising thicker etch mask area material. In this manner, selective etching of the adjustable film layer will selectively modify (e.g., etch) the adjustable film layer in regions of the film which deviate from the nominal value (e.g., regions of the film which are thicker than the nominal value) back to its designed value. In one embodiment, a wet etchant can be used for selective etching of the adjustable film layer. In another embodiment, a plasma etchant can be used for selective etching of the adjustable film layer.

Figure 7:
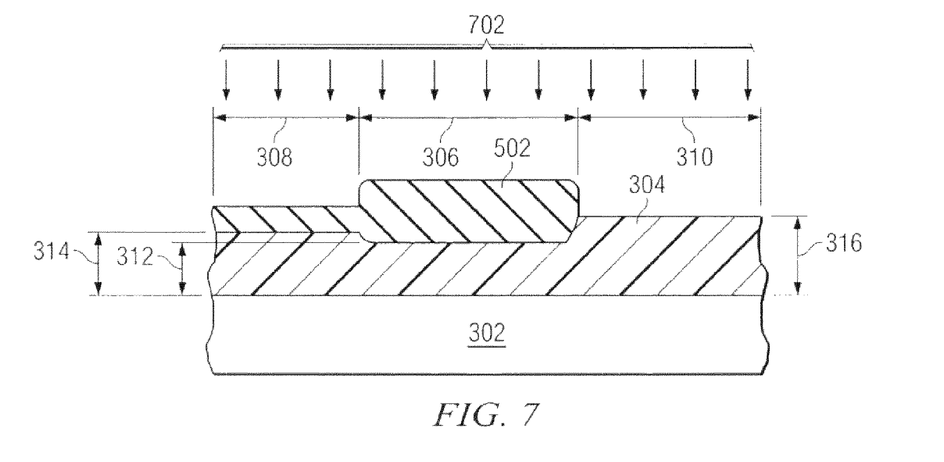
Figure 8:
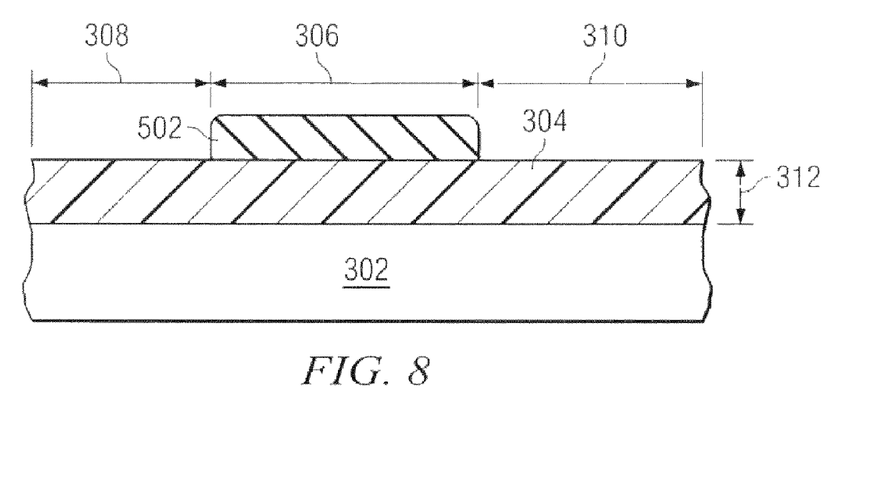

FIGS. 7-8 illustrate a selective etching of the adjustable film layer. As shown in FIG. 7, the etchant 702 will begin to etch the adjustable film layer 304 in region 310 first, because the etch mask layer 502 is totally removed in that region. As the etchant 702 removes the etch mask layer 502 it will eventually begin to remove the underlying adjustable film layer 304 in region 308. The etchant process thereby provides a larger etch of the underlying adjustable film layer in region 310 than in region 308 and no etch of the underlying adjustable film layer in region 306.

The resultant adjustable film layer is shown in FIG. 8. The adjustable film layer 304 has been selectively etched a manner that it comprises a substantially planarized adjustable film 304 (e.g., a uniform thickness film) once etching is complete. For example, in region 308, the adjustable film layer thickness has been reduced from a thickness 314 to a thickness 312. Similarly, in region 310, the adjustable film layer thickness has been reduced from a thickness 316 to a thickness 312. Once etching is complete the etch mask layer 502 can be removed and processing can continue. Therefore, as provided above, the method of FIG. 2 provides an in-situ adjustment of an adjustable film layer thereby providing an improvement in process control which results in improved device performance for integrated chips.

It will be appreciated that method 200 can be repeated to get finer and finer gradations of etching to provide even better adjustable film layer control across a local or global region of the semiconductor body.

Figure 9:
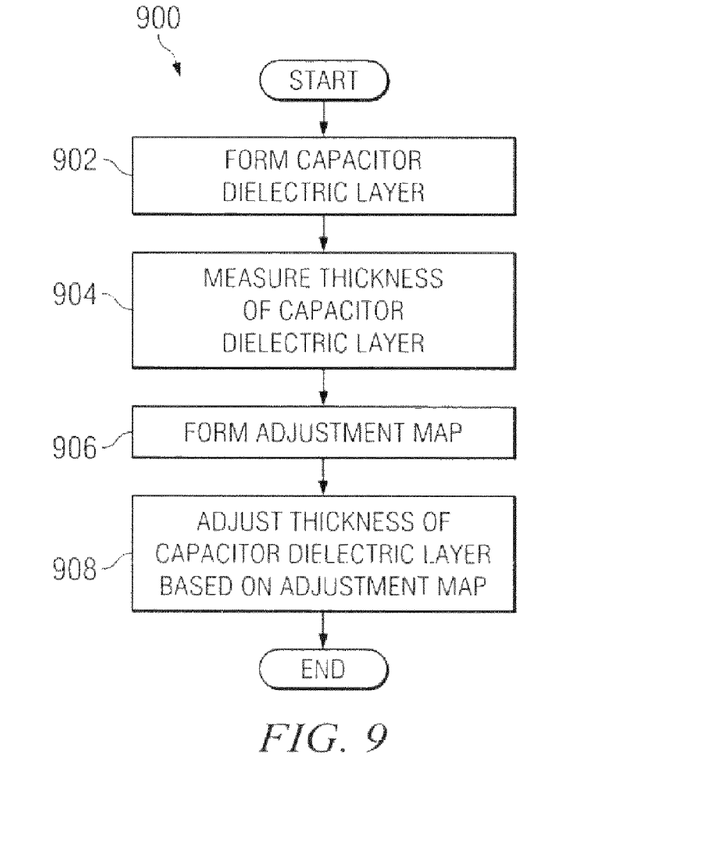
FIG. 9 is a particular embodiment of the present invention illustrating a flow diagram showing a method of improved process control of a semiconductor capacitor.

FIG. 9 illustrates a particular embodiment of the method of FIG. 2, a method 900 for forming a uniform capacitor dielectric layer, wherein a capacitor dielectric layer is selectively etched based upon a contour map to form a uniform capacitor dielectric layer over an array comprising a plurality of capacitors (e.g., MIM capacitor, MOS capacitor, etc.). FIGS. 10-12B are included to further aid in illustrating the method 900.

The method begins at 902 when a capacitive dielectric layer is formed. In one embodiment, the capacitor dielectric layer is formed by depositing a high-k dielectric film above a metal layer (e.g., copper metal interconnect layer). The capacitive dielectric layer may comprise one or more dielectric layers. In one embodiment, the capacitive dielectric layer is formed by a blanket deposition and is then selectively patterned to form individual devices using lithography techniques which are well known in the art.

Figure 10A:
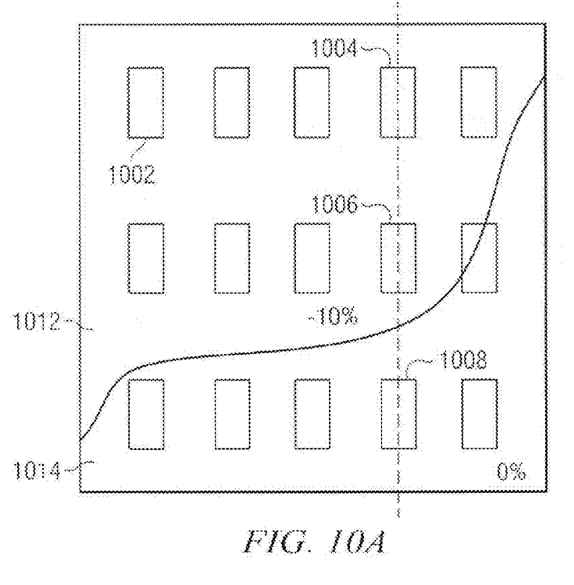
FIG. 10A illustrates a contour map of the section of the semiconductor wafer comprising an array of semiconductor capacitors according to the method of FIG. 9, wherein the contour map is overlaid onto a top view of capacitor dielectric regions.

FIG. 10A illustrates a top view of a section of a semiconductor wafer comprising an array of semiconductor capacitors, wherein the dielectric layer of respective capacitors 1002 is visible.

The thickness of the capacitor dielectric layer comprised within respective capacitors of the capacitor array is measured at 904. In one embodiment, the thickness of the dielectric layer corresponding to respective capacitors is measured in one or more locations. Preferably measurements are taken with sufficient spatial frequency to produce a high resolution contour map.

Figure 10B:
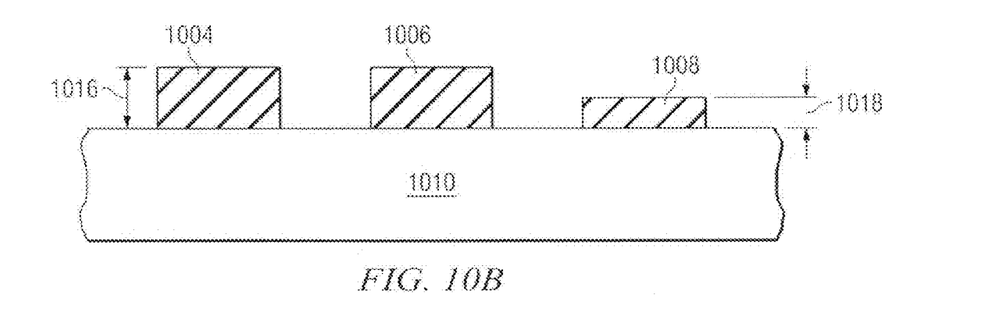
FIG. 10B illustrates a cross sectional view of a semiconductor body of FIG. 10A.

Due to process variation in the different levels of the capacitor (e.g., variations in the thickness of the capacitor dielectric) the capacitance of devices within the array will vary. FIG. 10B illustrates a cross sectional view of the same region of the capacitor array. FIG. 10B shows the variation in thickness of the capacitors dielectric film between devices within the array. For example, the dielectric film of capacitor dielectric layers 1004 and 1006 have been formed to a thickness of 1016 while capacitor dielectric layer 1008 has been formed to a smaller thickness of 1018. Since thickness 1016 and is greater than thickness 1018 the capacitors formed from capacitor dielectric layers 1004 and 1006 is greater than the capacitor formed from capacitor dielectric layer 1008 (i.e., since $C = \kappa^* \in_0 A/d$, wherein C is the capacitance, d is the distance between electrodes, A is the area of the electrodes, and $\kappa, \in_0$ are constants).

At 904 a two dimensional contour map is formed from the capacitor dielectric thickness measurements taken at 902. In one particular embodiment, the contour map comprises a detail of the percentage adjustment to the capacitor dielectric layer within respective contours that would bring capacitors in the contour to the designed capacitance value. For example, FIG. 10A illustrates a contour map overlaid on the array of semiconductor capacitors dielectric layers. The contour map illustrates a region 1014 comprising capacitors having a dielectric thickness with a nominal thickness and a region 1012 comprising capacitors having a dielectric thickness that would require a 10% percent adjustment to achieve the nominal (i.e., designed) thickness of the capacitor dielectric layer.

Adjustment is made to the capacitors at 906. Adjustment may be performed through use of a low resolution (micron level) digital micro-mirror mask (DMD exposure) to selectively pattern an etch mask layer (e.g., photoresist mask layer) configured above the capacitor dielectric layer. The information from the contour map can be feed into the DMD exposure tool and by varying the active areas of the (e.g., mirrors or transmissive areas) the desired pattern can be formed in the etch mask layer. In other words, the DMD provides for on-the-fly creation of trimming masks (e.g., photomasks), and due to the lower resolution requirements of a dielectric thickness variation adjustment does so while avoiding the cost of creating reticle masks.

Figure 11A:
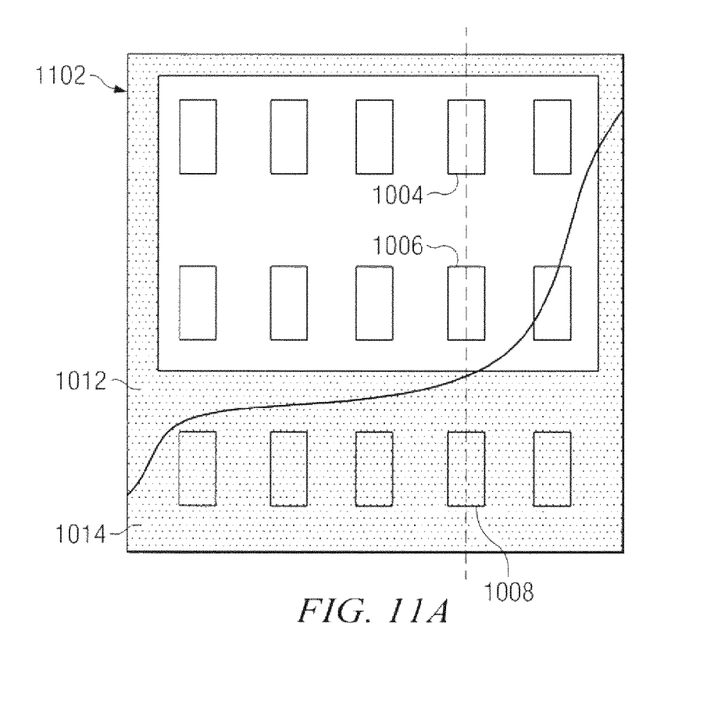
FIG. 11A-11B illustrates a top view and a corresponding cross sectional of the semiconductor wafer comprising an array of semiconductor capacitors with an overlaid hard mask comprising openings to expose the underlying layers to an etch.
Figure 11B:
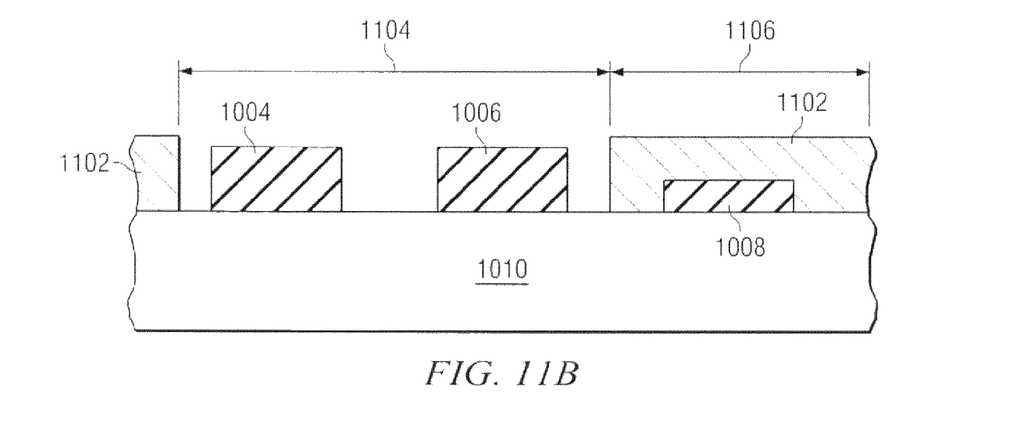

In one particular embodiment, illustrated in FIGS. 11A and 11B, a photoresist mask layer 1102 is deposited onto the capacitor dielectric layer (e.g., 1004, 1006, and 1008). In such an embodiment, the photoresist mask layer 1102 is selectively patterned by the DMD exposure system resulting in formation of a photoresist mask layer 1102 having an open area 1104 and a masked area 1106 (e.g., resulting in a photoresist mask layer having a topology of various thicknesses). For example, as shown in FIGS. 11A and 11B, the capacitor dielectric layers, 1004 and 1006, comprised within region 1012 (i.e., the region having the greatest dielectric thickness) will undergo the largest exposure and largest subsequent reduction in overlying photoresist mask layer 1102 thicknesses during patterning (e.g., reduction of the capacitor dielectric layer will increase the capacitance of the associated capacitor thereby adjusting the capacitance to appropriate values). Similarly, the capacitor dielectric layer 1008 comprised within region 1014 (i.e., the having a nominal capacitance) will experience no reduction in the thickness of the overlying photoresist mask layer 1102 during patterning.

Figure 12A:
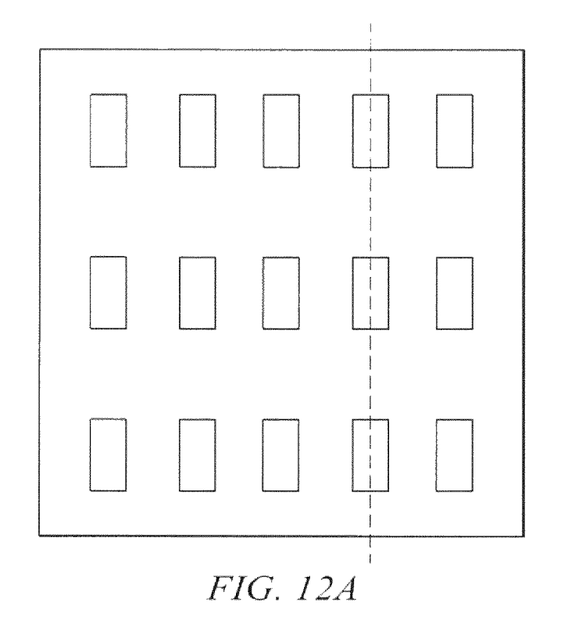
FIG. 12A-12B illustrates a top view and a corresponding cross sectional view of the semiconductor wafer comprising an array of semiconductor capacitors after the underlying layer has undergone the etch.
Figure 12B:
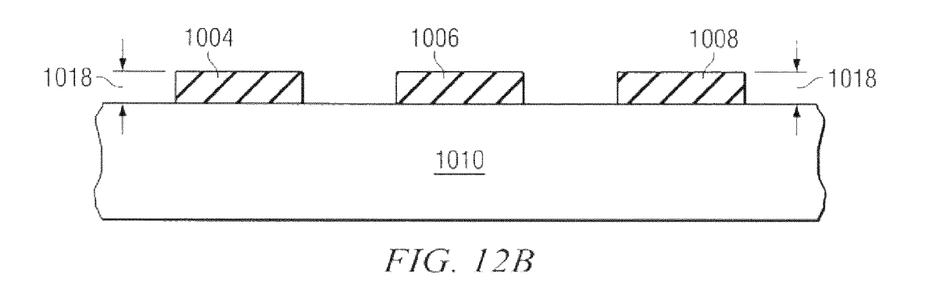

The semiconductor body is then selectively etched to reduce the thickness of the capacitor dielectric layer in region 1012. The patterned etch mask layer is removed during the etch process, and capacitor dielectric areas comprising a thinner etch mask layer (e.g., 1004 and 1006) will be etched more than those capacitor dielectric areas comprising a thicker etch mask layer (e.g., 1008). As shown in FIGS. 11A and 11B, the etch will penetrate the exposed resist area, but not the unexposed grey area, and therefore, the etch will remove some of the capacitor dielectric in the exposed area, leaving the dielectric with a more uniform thickness across the semiconductor body. The resultant capacitor array is shown in FIGS. 12A and 12B. As shown in FIGS. 12A and 12B, the capacitor dielectric layers, 1004 and 1006, have been etched such that their capacitor dielectric thickness 1018 is equal to the capacitor dielectric thickness 1018 of capacitor dielectric layer 1008 (i.e., the capacitor dielectric layer having a designed thickness).

Therefore, the method 900 provides a method of in-situ wafer processing adjustment by which the capacitor dielectric layer of a capacitor array is made uniform and the corresponding capacitances of the passive devices comprised therein is brought in line with the designed values.

While reference is made throughout this document to exemplary structures in discussing aspects of methodologies described herein (e.g., those structures presented in FIGS. 10-12B while discussing the methodology set forth in FIG. 9), those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein. Further, some regions that are illustrated as having distinct or abrupt edges may not be so precisely delineated, but may instead blend slightly with other regions. This is particularly true of doped or implanted regions that may diffuse with other regions, particularly at abutting edges.

What is claimed is:

1. A method for forming a uniform film thickness over a semiconductor body, comprising:
    forming an adjustable film layer over the semiconductor body;
    measuring a plurality of thicknesses from spatially diverse locations of the adjustable film layer;
    forming a contour map based upon the measured plurality of thicknesses, wherein the contour map illustrates variations in thickness of the adjustable film layer over a region of the semiconductor body;
    depositing an etch mask layer above the adjustable film layer;
    selectively patterning the etch mask layer to varying thicknesses based upon the contour map using a reticleless exposure system, wherein selectively patterning the etch mask layer comprises selectively exposing areas of the etch mask layer for different exposure times depending on the thickness of the underlying adjustable film layer; and
    selectively etching the semiconductor body to substantially planarize the adjustable film layer, wherein selectively etching the semiconductor body removes the patterned etch mask layer thereby providing etching of the underlying adjustable film layer proportional to the exposure time of the patterned etch mask layer.

2. The method of claim 1, wherein selectively etching the semiconductor body is performed in-situ to processing the semiconductor body.

3. The method of claim 2, wherein the adjustable film layer comprises a layer relating to an operational parameter of a device such that adjustment of the adjustable film layer provides adjustment to the operational parameter.

4. The method of claim 2, wherein the adjustable film layer comprises a capacitor dielectric layer of a semiconductor capacitor.

5. The method of claim 2, wherein the adjustable film layer comprises a gate oxide layer of a semiconductor device.

6. The method of claim 2, wherein the adjustable film layer comprises a polysilicon layer of a semiconductor resistor.

7. The method of claim 2, wherein the etch mask layer comprises a hardmask comprising a positive photoresist.

8. The method of claim 2, wherein the reticleless exposure system comprises a digital micromirror device (DMD) exposure system.

9. The method of claim 2, wherein the contour map comprises a detail percentage adjustment to the adjustable film layer within respective contours of the contour map.

10. The method of claim 2, wherein the contour map comprises a two dimensional contour map.

11. The method of claim 2, further comprising removing the etch mask layer after selectively etching the adjustable film layer is completed.

12. The method of claim 2, wherein selectively patterning the etch mask layer to varying thicknesses comprises exposing three or more spatial regions of the etch mask layer to three or more different exposure times.

13. A method for forming a uniform capacitor dielectric layer over a capacitor array formed on a semiconductor body, comprising:
    forming a capacitor dielectric layer over an underlying capacitor electrode;
    measuring a plurality of thicknesses from spatially diverse locations of the capacitor dielectric layer;
    forming a contour map based upon the measured plurality of thicknesses, wherein the contour map illustrates variations in thickness of the capacitor dielectric layer over a region of the semiconductor body;
    depositing an etch mask layer above the capacitor dielectric layer;
    selectively patterning the etch mask layer to varying thicknesses based upon the contour map using a reticleless exposure system, wherein selectively patterning the etch mask layer comprises selectively exposing areas of the etch mask layer for different exposure times depending on the thickness of the underlying capacitor dielectric layer; and
    selectively etching the semiconductor body to substantially planarize the capacitor dielectric layer, wherein selectively etching the semiconductor body removes the patterned etch mask layer thereby providing etching of the underlying capacitor dielectric layer proportional to the exposure time of the patterned etch mask layer.

14. The method of claim 13, wherein the capacitor dielectric layer comprises one or more high-k dielectric layers.

15. The method of claim 13, wherein the etch mask layer comprises a hardmask comprising a positive photoresist material.

16. The method of claim 13, wherein the reticleless exposure system comprises a digital micromirror device (DMD) exposure system.

17. The method of claim 13, wherein the contour map comprises a two dimensional contour map illustrating a detail percentage adjustment to the capacitor dielectric layer within respective contours of the contour map.

18. A method for forming a uniform film thickness over a semiconductor body, comprising:
    forming an adjustable film layer over the semiconductor body;
    measuring a plurality of thicknesses from spatially diverse locations of the adjustable film layer;
    forming a contour map based upon the measured plurality of thicknesses, wherein the contour map illustrates variations in thickness of the adjustable film layer over a region of the semiconductor body;
    depositing an etch mask layer above the adjustable film layer;
    selectively patterning the etch mask layer to varying thicknesses based upon the contour map, wherein selectively patterning the etch mask layer comprises selectively exposing different regions of the etch mask layer to different exposure levels depending on the thickness of the underlying adjustable film layer; and
    selectively etching the semiconductor body in-situ to processing the semiconductor body to substantially planarize the adjustable film layer, wherein selectively etching the semiconductor body removes the patterned etch mask layer thereby providing etching of the underlying adjustable film layer proportional to the exposure time of the patterned etch mask layer.

19. The method of claim 18, wherein selectively patterning the etch mask layer is performed by a reticleless exposure system.

20. The method of claim 19, wherein the reticleless exposure system comprises a digital micromirror device (DMD) exposure system.

* * * * *